United States Patent
Kanatsu

(10) Patent No.: US 6,819,371 B2
(45) Date of Patent: Nov. 16, 2004

(54) FLAT PANEL DISPLAY DEVICE INCLUDING SLITTED TAPE CARRIER PACKAGES AND MANUFACTURING METHOD THEREOF

(75) Inventor: Tsutomu Kanatsu, Tokyo (JP)

(73) Assignee: NEC LCD Technologies, Ltd. (JP)

( * ) Notice: Subject to any disclaimer, the term of this patent is extended or adjusted under 35 U.S.C. 154(b) by 0 days.

(21) Appl. No.: 10/615,818

(22) Filed: Jul. 9, 2003

(65) Prior Publication Data

US 2004/0012746 A1 Jan. 22, 2004

Related U.S. Application Data

(62) Division of application No. 09/613,476, filed on Jul. 11, 2000, now Pat. No. 6,636,281.

(30) Foreign Application Priority Data

Jul. 12, 1999 (JP) ............................................ 11/198130

(51) Int. Cl.⁷ ...................... G02F 1/1333; G02F 1/1345
(52) U.S. Cl. .......................... 349/58; 349/150; 349/151; 439/67
(58) Field of Search ................................ 349/150, 151, 349/58; 439/67

(56) References Cited

U.S. PATENT DOCUMENTS 5,726,491 A  *  3/1998  Tajima et al. ............... 358/1.18
6,104,464 A  *  8/2000  Adachi et al. ............... 349/150
6,319,019 B1  *  11/2001  Kwon et al. ................... 439/67
6,402,527 B2  *  6/2002  Ota .............................. 439/67

FOREIGN PATENT DOCUMENTS

| JP | 2616564 | | 3/1997 | ......... G02F/1/1345 |
| JP | 9265104 | * | 10/1997 | ......... G02F/1/1345 |
| JP | 11121682 | * | 4/1999 | ......... G02F/1/1345 |

* cited by examiner

Primary Examiner—Huyen Ngo
(74) Attorney, Agent, or Firm—Hayes Soloway P.C.

(57) ABSTRACT

In a flat panel display device, in which a display panel 1 loosely fitted on a main surface of a chassis 4 and circuit substrates held in hook portions provided on side surfaces of the chassis are connected each other through TCP's by bending the latter TCP's, and a method for manufacturing the same device, a main slit for a rounded portion of each TCP is formed in a rounded portion of the TCP and an auxiliary sub slit is also formed adjacent to the main slit. In order to reduce the peeling force exerted on connecting/fixing portions between the TCP's and the display panel, the circuit substrate is pulled up by bending the main and sub slits and then returning the sub slit to a flat state to insert the circuit substrate into the hook portions.

10 Claims, 12 Drawing Sheets

FIG. 1 (PRIOR ART)
FIG. 1A
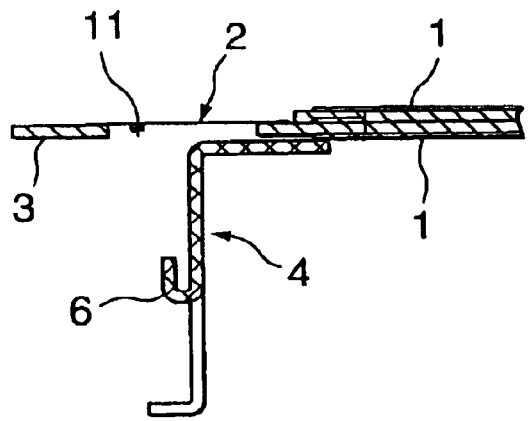
FIG. 1B
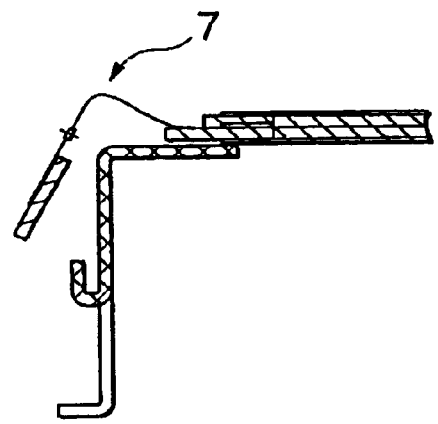
FIG. 1C
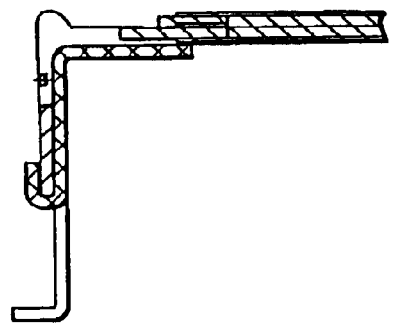

FIG. 7

MANUFACTURING FLOWCHART OF LIQUID CRYSTAL DISPLAY DEVICE

CONTACT ONE END OF TCP HAVING TWO SLITS TO PERIPHERAL PORTION OF LIQUID CRYSTAL PANEL UNDER PRESSURE

MOUNT CONNECTING SUBSTRATE ON THE OTHER END OF TCP BY PRESSURE-CONTACT OR SOLDERING

LOOSELY MOUNT LIQUID CRYSTAL PANEL ON UPPER SURFACE OF CASING

PULL UP CONNECTING SUBSTRATE BY BENDING TWO SLITS OF TCP

ENGAGE CONNECTING SUBSTRATE WITH HOOK PORTIONS ON SIDE SURFACE OF CASING BY RETURNING ONE OF TWO SLITS TO FLAT STATE

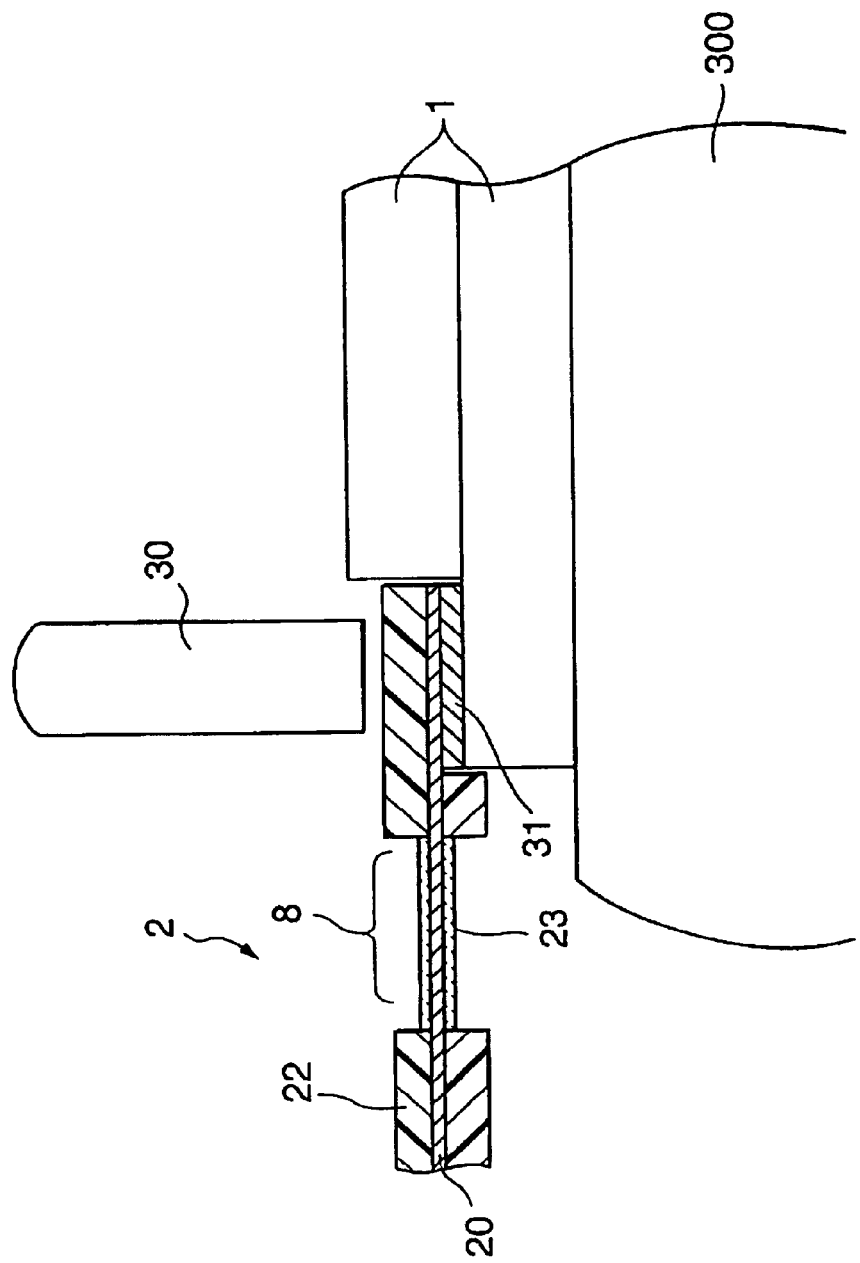

FLAT PANEL DISPLAY DEVICE INCLUDING SLITTED TAPE CARRIER PACKAGES AND MANUFACTURING METHOD THEREOF

CROSS REFERENCE TO RELATED APPLICATION

This Application is a divisional of U.S. application Ser. No. 09/613,476, filed Jul. 11, 2000, now U.S. Pat. No. 6,636,281, issued Oct. 21, 2003.

BACKGROUND OF THE INVENTION

1. Field of the Invention

The present invention relates to a connecting construction of a flat panel display device such as a liquid crystal display device and a drive circuit substrate thereof and, particularly, to a flat panel display device having a construction, in which a display panel provided with a plurality of TCP's (Tape Carrier Packages) is easily detachably mounted on a casing of the flat panel display device, and a manufacturing method thereof.

2. Description of the Prior Art

As a flat panel display device, a liquid crystal display device, a plasma display device and an electroluminescence device, etc., are well known and, particularly, the liquid crystal display device has been used widely as a display of a mobile information terminal, a notebook type personal computer, and a home use word processor, for which the portability is required.

As a typical example of the flat panel display device, the liquid crystal display device will be described. With the recent tendency of reduction of size and weight of an electronic device on which a liquid crystal display device is mounted, a further reduction of size of the liquid crystal display device is required. Particularly, reduction of an area of the liquid crystal display device except an image display region thereof, that is, a frame portion of the liquid crystal display device, and reduction of thickness of the liquid crystal display device itself are important problems to be solved.

In order to drive the liquid crystal display device, semiconductor driver elements each in the form of such as LSI, etc., called "driver LSI's" are required. In order to achieve the reduction of size of liquid crystal display device, a COG (Chip On Glass) method for directly forming the driver LSI on a display panel substrate has been developed. However, if the driver LSI directly formed on the display panel substrate is defective, the whole panel substrate becomes defective. In order to solve such problem, it has been usual to arrange a driver LSI on each TCP (Tape Carrier Package) by using TAB (Tape Automated Bonding) so that the driver LSI's are connected to a display panel substrate through the TCP's.

The TCP manufactured by using the TAB includes a plurality of lead electrodes, which are connected to protruded electrodes, called "bumps", of the LSI called "bare chip". The lead electrodes on the side of the display panel or the circuit substrate are called as "outer leads" and those on the side of the LSI are called as "inner leads". The lead electrodes comprise a number of stripe-shaped electrodes formed by patterning a copper foil formed on an insulating base film of such as polyimide, etc. In order to highly reliably connect the LSI by contacting the bumps of the LSI to the inner leads under pressure, the base film is made thick enough to provide a sufficient mechanical strength thereof during the pressure-contact step.

Therefore, when the TCP having one end connected to the display panel is bent to fit it to a suitable holding member provided on a chassis of the display device, the bending operation is facilitated by forming a slit or slits in only a portion or portions of the TCP at which the latter is bent to form a rounded portion thereof. Japanese Patent No. 2616564 and Japanese Patent Application Laid-open No. H9-265104 disclose examples of a liquid crystal display device employing TCP's each having such slit or slits and a flexible portion.

Particularly, in the liquid crystal display device disclosed in Japanese Patent Application Laid-open No. H9-265104, a liquid crystal panel is held by a lock member such as protrusions provided on a chassis and circuit substrates each connected to a plurality of TCP's are held by hook portions provided on a side surface of the casing. With such construction, an assembling and disassembling of the liquid crystal display device are facilitated.

When this construction in which the circuit substrates and the display panel are merely held in positions without using adhesive, there is a merit that, when a liquid crystal panel becomes failure, an exchange of the liquid crystal panel with a new panel is facilitated.

However, in order to hold the circuit substrate by the hook portions, it is necessary to pull up the circuit substrate and then insert them into insides of the hook portions. In a case where circuit substrates are fixed to side surfaces of a chassis by adhesive, it is enough to merely bend TCP's at slit portions thereof so that a length of each TCP may be minimum. In the hooking type construction, which requires the pull-up step of the TCP's and the insertion step thereof into the hook portions, the length of each TCP is increased by an amount necessary for pulling the TCP up. Further, a peeling stress is generated in the connecting portion between the display panel and the TCP when the latter is pulled up. In addition, since the increased length portions of the TCP's are risen up from a plain of the connecting portion after the circuit substrate is hooked in the hook portions, it is necessary to provide a space for receiving the risen portion of the TCP.

Since the liquid crystal display device is usually used as a display of a portable information terminal, a notebook type personal computer or a home-use word processor, etc., the liquid crystal display device has to be not only highly compact but also durable against vibration and thermal shock. On the other hand, since, when the size of liquid crystal display panel is increased, the liquid crystal display panel may be deformed due to thermal expansion of the panel itself, the adhesive is usually not used to fix the liquid crystal panel to the chassis. Instead thereof, the liquid crystal panel is supported by only the hooking members as mentioned previously. The size of the liquid crystal panel and the positioning of the hooking members mounted on the chassis are determined by taking the fact that there are unavoidable machining errors (about several tenth millimeters each) of the liquid crystal panel and the chassis into consideration. That is, in order to improve the product yield of the flat panel display device, it is usual to design the size of the liquid crystal panel and the positioning of the hooking members mounted on the chassis such that the length of the hooking members mounted on the chassis is slightly larger than an ideal size of the liquid crystal panel in order to allow the liquid crystal panel to be reliably fitted in the chassis. Therefore, in a finished liquid crystal display device, there may be a case where the liquid crystal panel slightly moves with respect to the casing.

With such movement of the liquid crystal panel with respect to the casing, a stress is exerted on the TCP's connected to the liquid crystal panel, so that there is a possibility that a connection in the pressure-contacted portion between the circuit substrate and the TCP's and a connection in the pressure-contacted portion between the liquid crystal panel and the TCP's are broken. It is difficult to absorb such stress by only the slit provided in only the rounded portion of each TCP.

In the technique disclosed in Japanese Patent Application Laid-open No. H9-265104, a rounded portion of a TCP is received between a frame and a liquid crystal panel by pulling a flexible portion of the TCP up to a vicinity of an upper surface of the liquid crystal panel and then bending it down such that the rounded portion of the TCP has a large radius of curvature even after a circuit substrates are held by hook portions of a chassis.

Therefore, in view of prevention of peeling-off due to bending stress of the TCP caused by reduction of the size of liquid crystal display device, the provision of the rounded portion having large radius of curvature is meaningful. However, in view of further reduction of thickness and size of the flat panel display device, the structure has to be improved further. Further, in the construction, in which the TCP has such large rounded portion, the total length of the TCP is large. However, the length of the TCP should be as short as possible in view of high frequency characteristics of the display device.

For a reference purpose only, the above mentioned breaking phenomenon of the connection will be described with reference to FIGS. 1A to 1C, which show the steps of mounting a liquid crystal panel and a circuit substrate on a casing. A liquid crystal panel 1 is held on a main surface of a casing 4, as shown in FIG. 1A. Then, each TCP 2 is bent at a slit 7, which is provided in a region thereof to be rounded, along a ridge portion of the casing as shown in FIG. 1B and a circuit substrate is held in a hook portion 6 provided on the side surface of the casing 4 as shown in FIG. 1C.

As shown in FIG. 1B, in holding the circuit substrate 3 in the hook portion 6, it is necessary to pull up the rounded portion of the TCP's 2. When the TCP's 2 is pulled up in such manner, loads acting in opposite directions to peel off the TCP's 2 from the liquid crystal panel 1 are exerted on the junctions between the TCP's 2 and the liquid crystal panel 1, with which lead lines in the junctions may be broken.

Furthermore, in pulling the TCP's 2 up, loads are also exerted on connecting portions between the TCP's 2 and the circuit substrate 3, with which the connection between the TCP's 2 and the circuit substrate 3 may be broken.

The above-mentioned problems may also occur in other flat panel type display devices.

SUMMARY OF THE INVENTION

In view of the state of art mentioned above, an object of the present invention is to provide a flat panel display device having a connecting construction of each of TCP's, whose length is limited to a necessary minimum to reduce a size of a rounded portion thereof to thereby make thickness and size thereof possible to further reduce and a method for manufacturing the same flat panel display device.

The present invention is achieved on the basis of not a mere construction required by the rounded portions of the TCP's after the display device is completed. That is, the inventors of the present invention have studied the mechanism of stress generation in a TCP in the bending step of a slit of the TCP to form a rounded portion slit and found that a peel-off stress not only during an assembling operation of the display device but also after the completion of the display device can be relaxed without requiring an extra length of the TCP by newly providing an auxiliary slit in the TCP, which is bent during the assembling operation and returns to a flat state after the display device is completed. The present invention is achieved on the basis of the above-mentioned discovery.

That is, according to the present invention, a flat panel display device is featured by comprising a chassis, a display panel put on a main surface of the chassis, a circuit substrate held in a hook portion provided on a side surface of the chassis and a plurality of TCP's having one ends connected to the display panel and the other ends connected to the circuit substrate, each TCP having a first region extending substantially in parallel to a main surface of the chassis, a second region extending substantially in parallel to a side surface of the chassis, a rounded region between the first region and the second region and a third region provided in at least one of the first and second regions and extending in parallel to the extending direction of the rounded region, the third region having a higher flexibility than that of the at least one of the first and second regions.

That is, the TCP employed in the present invention includes not only an easily deformable region, which is easily bent and provided for the rounded portion, but also the auxiliary slit, which is temporarily bent. The slit for rounded portion will be referred to as "main slit" and the auxiliary slit will be referred to as "sub slit".

Furthermore, the present invention is featured by that the rounded region of the TCP in which the main slit is formed is positioned in a level lower than a surface level of the first region.

Moreover, the present invention is featured by that the TCP further has a driver element-connecting region and the third region is constructed with a plurality of lead lines covered by a flexible insulating film thinner than an insulating film in the vicinity of the driver element-connecting region.

The present invention is further featured by that the display panel is loosely fitted on the chassis such that a relative mechanical displacement of the display panel to the chassis is absorbed in the third region.

Furthermore, in the flat panel display device of the present invention, the sub slit of the TCP may be provided in the first region and connected to the main slit in the rounded region to form a wide slit.

It is preferable that a distance between a center of the main slit and a center of the sub slit is preferably larger than a depth of the hook portion.

Moreover, a main body of the TCP of the present invention is constructed with a plurality of lead lines covered by an insulating flexible film and the main and sub slits extend in directions perpendicular to the extending direction of the TCP from the liquid crystal panel to the circuit substrate, respectively, the main and sub slits being constructed with the plurality of the lead lines covered by an insulating flexible coating member thinner than the insulating flexible film constituting the main body of the TCP.

According to the present invention, a method for manufacturing a flat panel display device is also provided, which method is featured by comprising the steps of holding a display panel having TCP's connected to a circuit substrate on a chassis, pulling up the circuit substrate by bending each TCP at a main slit for forming a rounded portion and a sub slit provided in the TCP such that a lower edge of the circuit substrate exceeds front edge of hook portion provided on the chassis and inserting the circuit substrate into the hook portion by returning the sub slit to an original flat state.

Particularly, the sub slit is featured by that it is provided between the main slit and the display panel and a bending direction of the sub slit in the step of pulling up the circuit substrate is opposite to a bending direction of the main slit.

Alternatively, the sub slit is featured by that it is provided between the main slit and the display panel and a bending direction of the sub slit in the step of pulling up the circuit substrate is the same as a bending direction of the main slit.

Alternatively, the sub slit is featured by that it is provided between the main portion slit and the display panel and is connected to the main slit to form a wide common slit and that a bending direction of the common slit in the vicinity of the circuit substrate in the step of pulling up the circuit substrate is opposite to a bending direction of the main slit in the vicinity of the display panel.

Particularly, the method for manufacturing a flat panel display device is featured by that the display panel is loosely fitted on the chassis.

In the present invention having such features, the load exerted on the TCP is absorbed by not only the main slit region but also the sub slit region, which is temporarily bent during the assembling operation. Therefore, when the liquid crystal panel or the circuit substrate moves on the chassis, it is possible to reduce the load exerted on the TCP by the main and sub slits. Consequently, it is possible to prevent the connection between the liquid crystal panel and the circuit substrates from being broken during the mounting of the circuit substrate and the circuit in the TCP from being broken during a vibration test or a shock test of the liquid crystal display device. Furthermore, according to the present invention, it is possible to reduce the number of assembling steps of the liquid crystal display device and the number of parts thereof to be assembled.

BRIEF DESCRIPTION OF THE DRAWINGS

This above-mentioned and other objects, features and advantages of the present invention will become more apparent by reference to the following detail description of the invention taken in conjunction with the accompanying drawings, in which:

FIGS. 1A to 1C illustrate an assembling steps for holding a circuit substrate connected to TCP's by a hook portion provided on a side surface of a chassis in a conventional flat panel display device;

FIG. 7 is a flowchart showing manufacturing steps of the flat panel display device according to the present invention;

FIG. 8 illustrates a pressure-contact operation of the TCP according to the first embodiment to the liquid crystal panel;

DETAILED DESCRIPTION OF THE PREFERRED EMBODIMENTS

Figure 2:
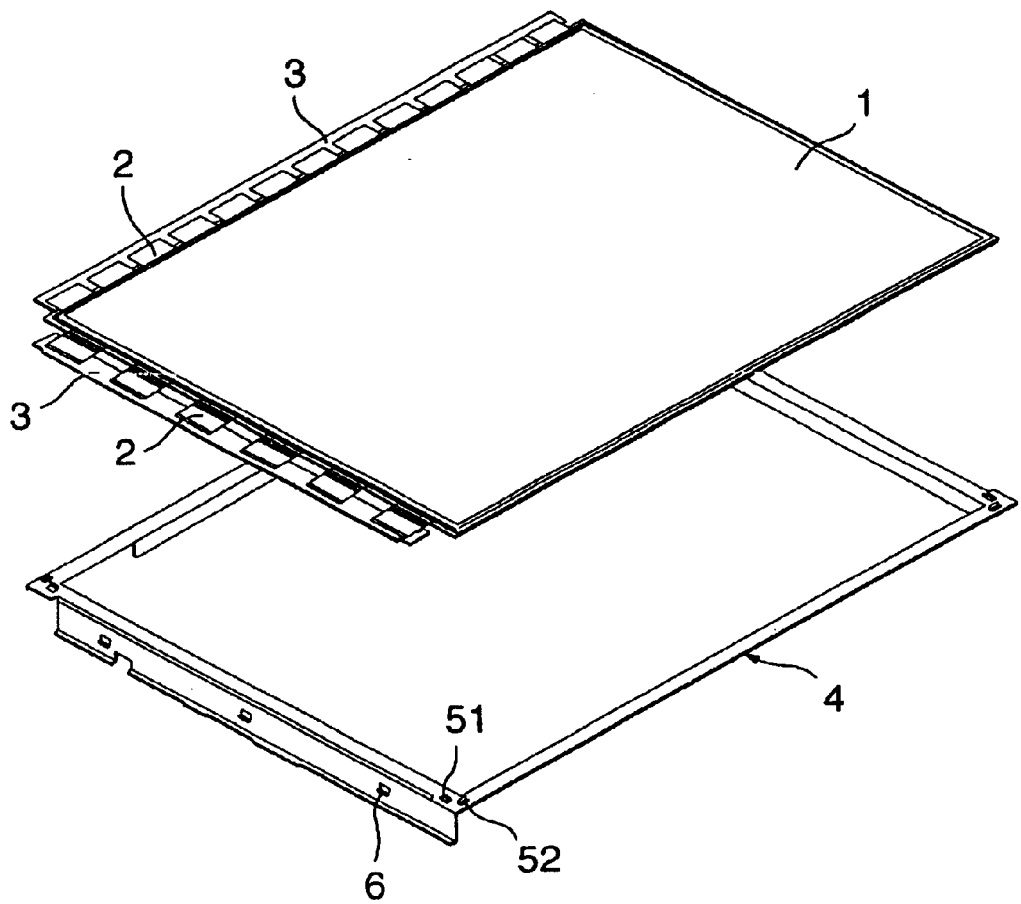
FIG. 2 is a disassembled perspective view of a liquid crystal panel having TCP's and a chassis, according to the first embodiment of the present invention.

The first embodiment of a flat display device of the present invention will be described with reference to FIGS. 2 to 6 in which the same or equivalent portions are depicted by the same reference numerals, respectively.

Figure 3:
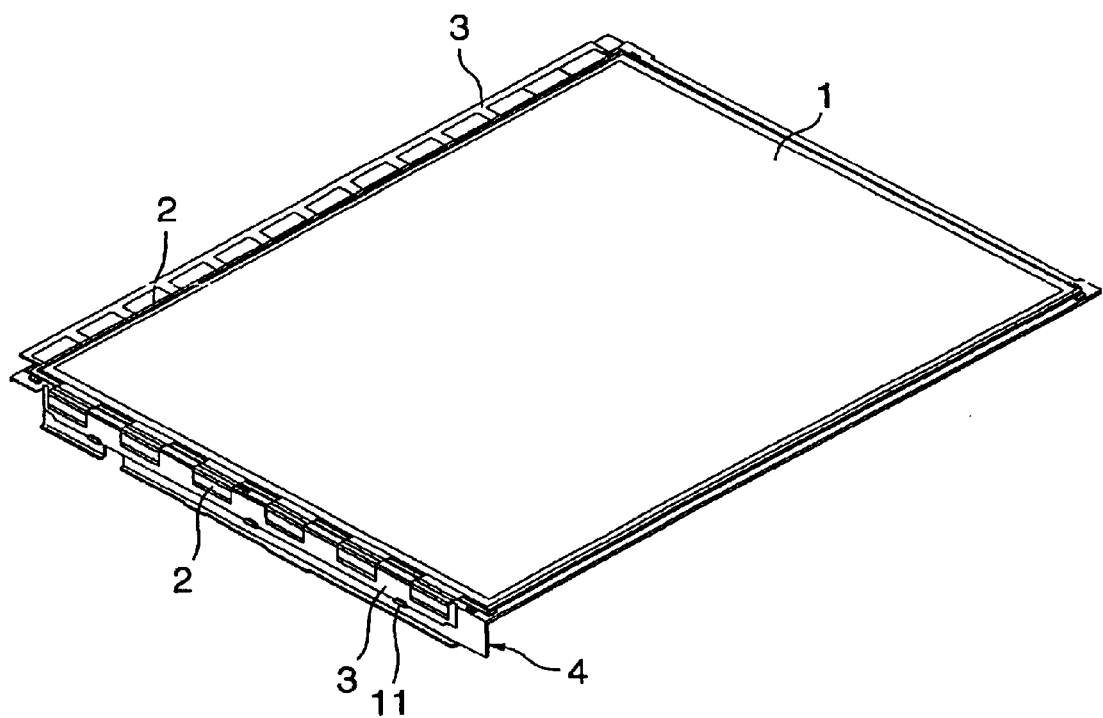
FIG. 3 is a perspective view of the liquid crystal panel and the chassis shown in FIG. 2 in an assembled state.

As shown in FIG. 2, one ends of each of a plurality (13) of TCP's 2 is connected to an upper side of a liquid crystal panel 1 and one end of each of a plurality (6) of TCP's 2 is connected to a left side of a liquid crystal panel 1. The other ends of the TCP's 2 having the one ends connected to the upper side of the liquid crystal panel 1 are commonly connected to a circuit substrate 3 and the other ends of the TCP's 2 having the one ends connected to the left side of the liquid crystal panel 1 are commonly connected to another circuit substrate 3. The liquid crystal panel 1 is put on an area of an upper surface of a frame shaped chassis 4, which is defined by four pairs of protrusions 51 and 52 provided in four corners of the upper surface of the chassis 4. The liquid crystal panel 1 positioned in the area defined by the four pairs of the protrusions 51 and 52 is held on the chassis 4 by bending the TCP's 2 down at a ridge portion of each side of the chassis 4 and inserting the circuit substrate 3 connected to the TCP's 2 into hook portions 6 provided on a side surface of the chassis 4, as shown in FIG. 3. In the shown example, three hook portions 6 are provided on each side surface of the chassis 4. A molded resin or a punched metal plate may form the chassis 4. Also shown in FIG. 3 is driver LSI 11 located on TCP's 2, which is a semiconductor driver element for driving the liquid crystal display device.

Figure 4:
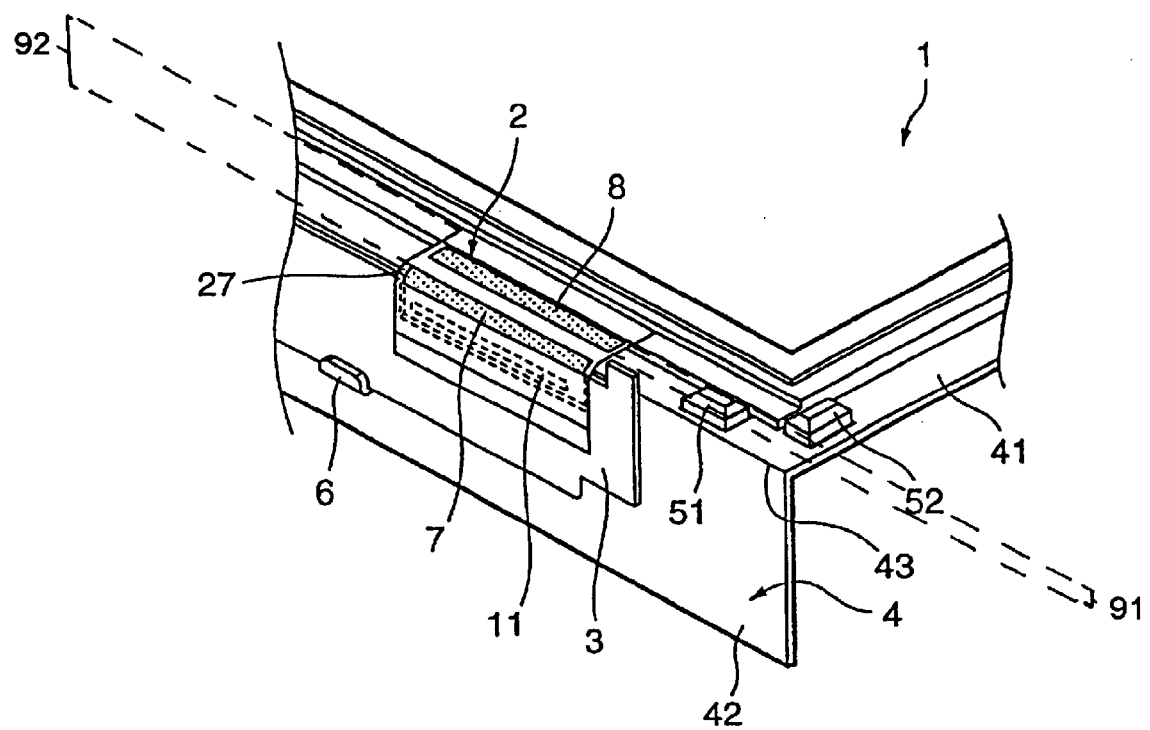
FIG. 4 is an enlarged perspective view of a corner portion of the assembled liquid crystal panel and the chassis shown in FIG. 3.

This embodiment will be described in more detail with reference to FIG. 4, which is an enlarged perspective view of one of the four corner portions of the chassis of the liquid crystal display device. As shown in FIG. 4, a main slit 7 and a sub slit 8 parallel to the main slit 7 are formed in each TCP 2. The main slit 7, which is provided at the ridge of the side surface of the chassis 4 in an assembled state, extends along a rounded portion 27 of the TCP 2 and the sub slit 8, which is flat on a main surface 41 of the chassis 4 in the assembled state, is formed in parallel to the main slit 7. Particularly, as shown in FIG. 4, the sub slit 8 is arranged such that it is positioned in a flexible region 92 disposed within a first region 91, said first region 91 comprising the portion of the TCP 2 disposed between the main slit 7 and the connecting portion between the liquid crystal panel 1 and the TCP 2.

The main slit 7 in the present invention constitutes the rounded portion of the TCP and functions to facilitate the bending of the TCP.

The sub slit 8 functions to temporarily bend the TCP and is returned to a flat state after the liquid crystal display device is assembled. The sub slit 8 is necessary to reduce the length of the TCP. That is, the function and location of the sub slit 8 are different from those of the main slit 7.

Therefore, although Japanese Patent Publication No. 2616564 discloses the liquid crystal display device employing TCP's each having two slits for deforming the TCP to a U-shape, the disclosed slits correspond, in function, to the main slit of the present invention and there is neither disclosure nor suggestion of slit corresponding to the sub slit of the present invention.

The rounded portion 27 of the TCP 2 is positioned in an opposing relation to a ridgeline 43 between the main surface 41 and a side surface 42 of the chassis 4 and extends in parallel to the ridgeline 43. In other words, the rounded portion 27 is formed in a region in which the TCP 2 is bent at right angle in a state where the liquid crystal panel 1 is held by the chassis 4 and the circuit substrates 3 are held by the hook portions 6.

Figure 5A:
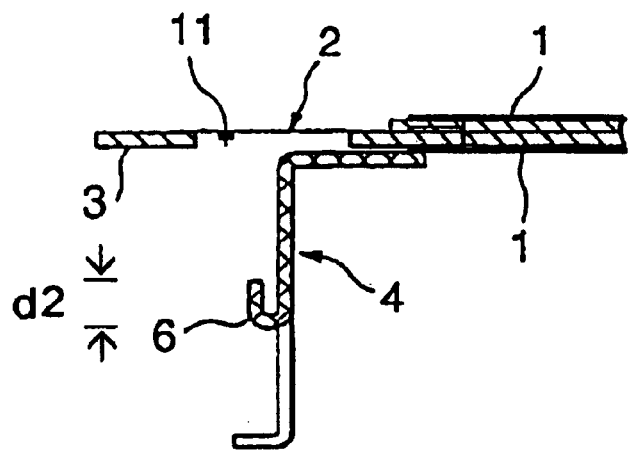
FIGS. 5A to 5C illustrate an assembling steps for holding the circuit substrate connected to the TCP's by hook portion provided on a side surface of the chassis shown in FIG. 4.
Figure 5B:
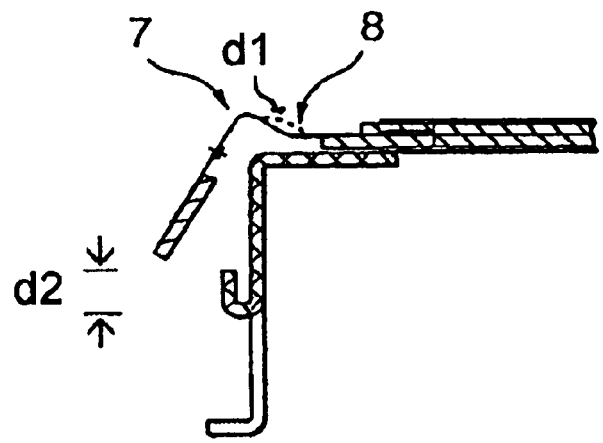

An operation for holding the circuit substrate 3 by the hook portions 6 of the chassis 4 by bending the TCP's 2 will be described with reference to FIGs. 5A to 5C. The liquid crystal panel 1 is put on the chassis 4 (FIG. 3 and FIG. 5A). Then, each of the TCP's 2 is pulled up using the sub slit 8 as a fulcrum and bent down at the main slit 7 (FIG. 5B). That is, the TCP 2 becomes convex at the main slit 7 and concave at the sub slit 8. It is noted that, as shown by dotted line a in FIG. 5B. the sub slit 8 could alternatively be bent convex when the TCP 2 becomes convex at the main slit 7.

Thereafter, the circuit substrate 3 is held in the hook portions 6 (FIG. 5C), in which state the sub slit 8 is returned to its original flat state.

Since, in this embodiment, the portion of the TCP 2 corresponding to the sub slit 8 becomes concave in the step in which the TCP becomes convex, the stress exerted on the region of the TCP 2 corresponding to the sub slit 8 during the TCP 2 is pulled up is absorbed by the sub slit region, it is possible to hook the circuit substrate 3 in the hook portions 6 without applying substantial load on the pressure-contacted portions of the TCP.

Since, when the liquid crystal panel 1 of the completed liquid crystal display device employing such TCP's 2 is moved with respect to the chassis 4, the TCP's 2 are easily deformed at the main slits 7 and the sub slits 8, it is possible to reduce loads exerted on the portions between the TCP's 2 and the circuit substrate 3 and between the TCP's 2 and the pressure-contacted portions to thereby provide reliable connections between the TCP's 2 and the circuit substrate 3 and between the TCP's 2 and the liquid crystal panel 1.

As described, although both the main slit 7 and the sub slit 8 have a common function of facilitating the bending of the TCP, the main functions of the main slit 7 and the sub slit 8 are different. Further, the main slit and the sub slit function together to absorb stress due to vibration, etc., after the liquid crystal display device is assembled. The stress absorbing function is substantially degraded when one of the main and sub slits is removed.

Incidentally, the driver LSI 11 is arranged between the main slit 7 and the circuit substrate 3 on a lower surface of the TCP 2. Although the driver LSI 11 may be provided on an upper surface of the TCP 2, it is preferable in view of space economy to receive the drive LSI 11 in a recess provided in a region of the circuit substrate 3, as shown in FIG. 4.

Figure 6:
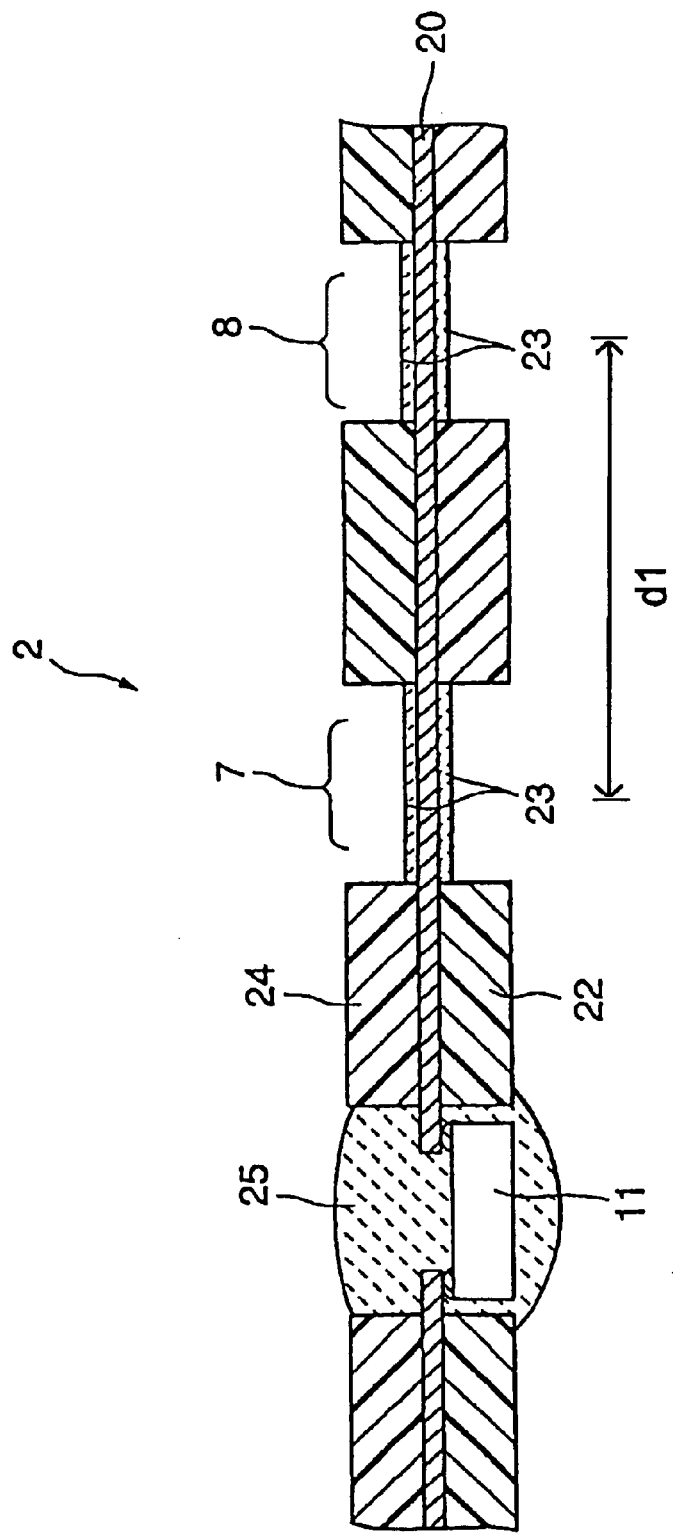
FIG. 6 is a cross section of the TCP, showing a main portion and slit portions of the TCP shown in FIG. 4.

The main and sub slits of the TCP 2 will be described in more detail with reference to FIG. 6. The TCP except portions thereof in which the main and sub slits are provided is constructed with a base film 22 of polyimide, copper lead lines 20 adhered to one surface of the base film 22 by an adhesive (not shown) and a resist film 24 covering the lead lines 20. The latter film is usually of the same material as that of the base film 22, that is, polyimide. Thus, the lead lines 20 are electrically insulated by the polyimide films. On the other hand, the slit portions 7 and 8 of the TCP are constructed with the lead lines 20 covered by a flexible resin 23 of polyimide. LSI 11 is coated with a protecting resin 25. Thickness of the flexible resin 23 is small compared with the thickness of the base film 22 of the TCP, so that the TCP can be bent easier at the slit portions than the other portion of the TCP. Furthermore, it becomes possible to reduce load exerted on the connecting portions of the TCP to other portions even when either the liquid crystal panel 1 or the circuit substrate 3 is moved with respect to the chassis since the movement can be absorbed by the slit portions.

A practical example of the TCP 2 is described below.

A total thickness of the TCP 2 is about 130 $\mu$m, wherein a thickness of the base film 22 is about 75 $\mu$m, a thickness of the adhesive 21 is about 12 $\mu$m, a thickness of the copper foil 20 is about 18 $\mu$m and a thickness of a resist film is about 25 $\mu$m. A total thickness of the slit portion is about 68 $\mu$m, wherein a thickness of each of the flexible resin 23 is about 25 $\mu$m. Width of the slit 7 as well as the slit 8 is 1 to 2 mm and a distance d1 between the center of the main slit 7 and the center of the sub slit 8 may be any provided that it is larger than a depth d2 of the hook portion 6 (as shown in FIGS. 5A–5C), that is, a vertical distance for which the circuit substrate is to be pulled up.

When the easiness of the pulling-up operation of the circuit substrate is taken into consideration, the position of the sub slit 8 is preferably in the vicinity of the liquid crystal display panel 1. Therefore, it is preferable that the sub slit 8 of the TCP is positioned in a location thereof closer to the liquid crystal panel 1 than an intermediate location between the main slit 7 and the liquid crystal panel 1. As an example, assuming the distance between the main slit 7 and the liquid crystal panel 1 being 6 mm, the sub slit 8 is positioned at a location separated from the liquid crystal panel 1 by 1 mm. Furthermore, since the bending angle of the sub slit 8 is smaller than the bending angle of the main slit 7, the width of the sub slit 8 may be smaller than that of the main slit 7.

Incidentally, portions of the liquid crystal display device, which have known constructions and are not directly related to the present invention, are not shown. That is, an outer frame of the chassis 4 for holding the frame of the liquid crystal panel 1 on the upper surface of the chassis 4 and protecting the TCP's 2 and the circuit substrates 3 and elastic members of such as rubber provided at a plurality of locations on the liquid crystal panel for restricting a movement of the liquid crystal panel 1 as small as possible, etc., are not shown.

Furthermore, since other parts related to the liquid crystal display device according to this embodiment and connections thereof are similar to those of the conventional liquid crystal display device, respectively, these parts are also not shown. For example, the parts related to the conventional liquid crystal display device and the connections thereof may include a back light, etc., a light guide plate for illuminating a liquid crystal panel 1, which are housed in the chassis 4. Furthermore, when the display capacity of the liquid crystal panel 1 is small, it is usual to incorporate a circuit for processing control signals in each of the circuit substrates 3. In the latter case, there is no need of newly providing large size circuit substrates. However, when the size of the liquid crystal panel 1 is large, it is usual to provide a large size control circuit substrate on the rear surface of the chassis and to electrically connect the circuit substrates 3 to the control circuit substrate through jumper lines. In such case, each circuit substrate 3 functions as a mere connecting substrate.

A method for manufacturing the liquid crystal display device according to the present invention will be described with reference to FIGS. 2 to 8.

FIG. 7 shows a flow chart of the method for manufacturing the liquid crystal display device. First, as shown in FIG. 8, one ends of each of the TCP's 2 is pressure-contacted to a peripheral portion of the liquid crystal panel 1. That is, the liquid crystal panel 1 is put on a working table 300, anisotropic electrically conductive films 31 are arranged in positions at which the one ends of the TCP's 2 in the peripheral portion of the liquid crystal panel 1 are to be pressure-contacted and the one ends of the TCP's 2 each having the main and sub slits are put on the anisotropic electrically conductive films 31, respectively. Then, a hot head 30 is put on the portions of the TCP's 2, in which the anisotropic electrically conductive films 31 exist to connect the TCP's 2 to the liquid crystal panel 1 through the anisotropic electrically conductive films 31. Thus, the TCP's 2 are connected to predetermined positions set along a horizontal and vertical sides of the liquid crystal panel 1. The predetermined positions are usually arranged along one of two horizontal sides of the liquid crystal panel 1 and along one of two vertical sides of the panel. However, there may be a case where the TCP's 2 are connected to all of the four sides of the square or rectangular liquid crystal panel 1.

Then, as shown in FIG. 2, the circuit substrates 3 are connected to the other ends of the TCP's 2 on the vertical and horizontal sides of the liquid crystal panel 1, respectively. The connection of the circuit substrate 3 to the other ends of the TCP 2 is performed by pressure-contact or soldering. The circuit substrate 3 is rectangular in a plan view, in which length of a long side of the circuit substrate 3 is substantially equal to the length of the horizontal or vertical side of the liquid crystal panel 1 and length of a short side of the circuit substrate 3 is substantially equal to the thickness of the liquid crystal display device.

Thereafter, as shown in FIG. 3, the liquid crystal panel 1 connected to the circuit substrates 3 through the TCP's 2 is arranged in a predetermined position on the chassis 4. The predetermined position is defined by the four pairs of the protrusions 51 and 52 provided at the four corners of the upper surface of the chassis 4. Distances between adjacent pairs of the protrusions 51 and 52 are set slightly larger than the size of the liquid crystal panel 1 such that the liquid crystal panel 1 is loosely held by the protrusion pairs. The reason for setting the distances between adjacent protrusion pairs slightly larger than the size of the liquid crystal panel is that there are unavoidable manufacturing errors during the manufacture of the liquid crystal panel. Therefore, yield of the liquid crystal display device can be improved by setting the distances between adjacent protrusion pairs slightly larger than the size of the liquid crystal panel. Furthermore, the liquid crystal panel 1 is preferably not adhered to the chassis 4 by an adhesive, etc., in order to facilitate a replacement of the liquid crystal panel 1 when the latter is failed. Since, in this embodiment, the liquid crystal panel 1 is held on the chassis 4 by the protrusion pairs 51 and 52 with a small play, the liquid crystal panel 1 may move slightly on the chassis 4.

After the liquid crystal panel 1 is put on the upper surface of the chassis 4, the circuit substrate 3 is inserted into the hook portions 6 on the side surface of the chassis 4 by bending the TCP's 2 at the main and sub slits 7 and 8. A plurality of the hook portions 6 may be provided on each side surface of the chassis 4. In this embodiment, the number of the hook portions 6 on one side surface of the chassis 4 is three and the circuit substrates 3 are not adhered to the hook portions 6 in order to facilitate the replacement of the liquid crystal panel 1 and to improve the yield of the liquid crystal display device.

According to the liquid crystal display device of the first embodiment and the manufacturing method thereof, the replacement of the liquid crystal panel 1 is facilitated. Furthermore, according to the first embodiment, it is possible to prevent the connections between the liquid crystal panel 1 and the circuit substrates 3 from being broken during the circuit substrates 3 are mounted and to prevent the lead lines of the TCP's 2 from being broken during the vibration test and/or shock test of the flat panel display device. Furthermore, it is possible to reduce the number of the assembling steps of the liquid crystal display device and the number of parts of the same device.

Figure 9:
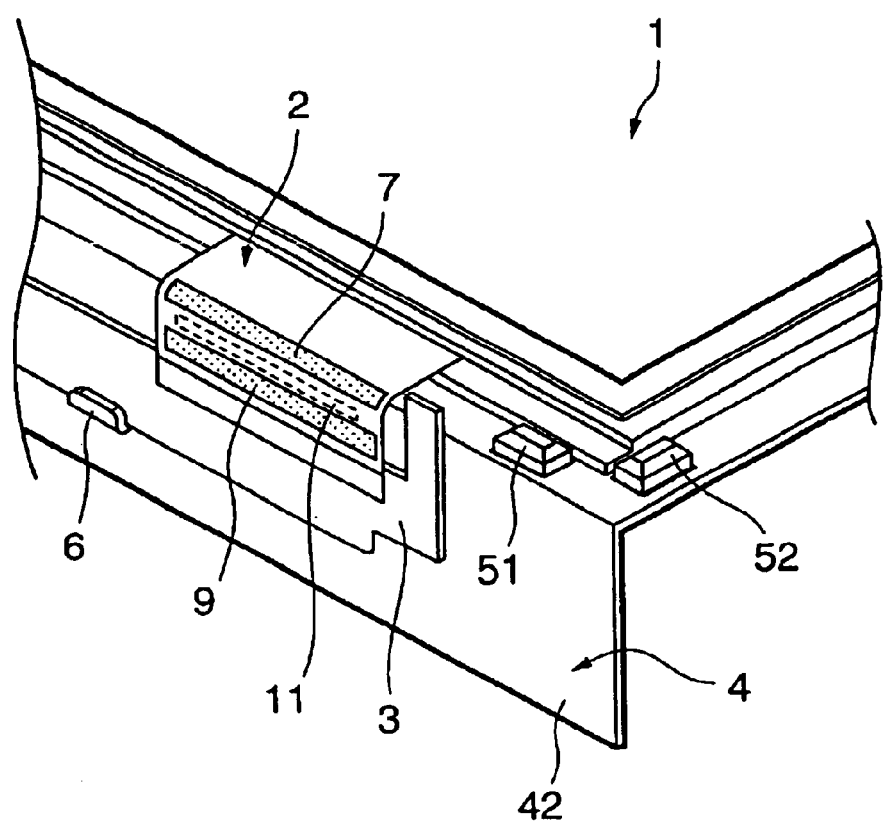
FIG. 9 is an enlarged perspective view of a corner portion of the assembled liquid crystal panel and the chassis according to the second embodiment of the present invention.

The second embodiment of the TCP according to the present invention will be described with reference to FIG. 9. In FIG. 9, the position of a main slit 7 of the TCP is the same as that in the first embodiment. However, a sub slit 9, which is temporarily bent in only the step of inserting a circuit substrate 3 into hook portions 6, is provided in between the circuit substrate 3 and a driver LSI 11.

Figure 10A:
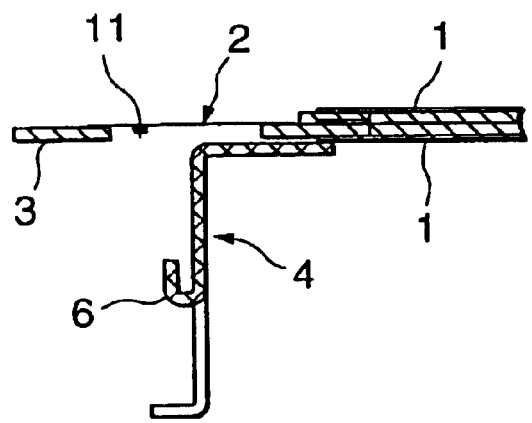
FIGS. 10A to 10C illustrate an assembling steps for holding the circuit substrate connected to the TCP's by a hook portion provided on a side surface of the chassis shown in FIG. 9.
Figure 10B:
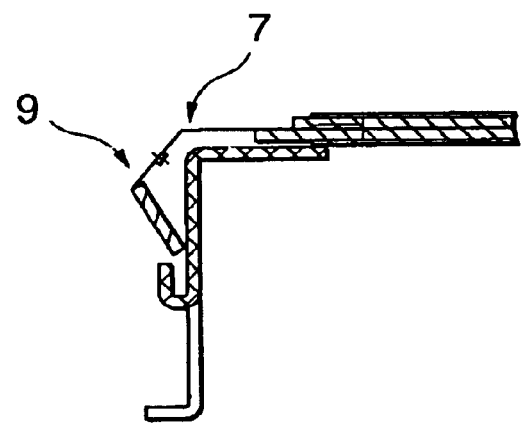
Figure 10C:
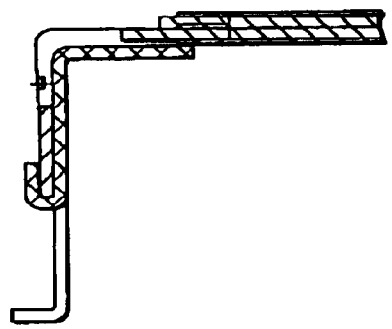

Although the liquid crystal display device according to the second embodiment and a manufacturing method thereof are similar to those of the first embodiment, the bending method of the TCP is different from that in the first embodiment. The difference is shown in FIGS. 10A to 10C.

The inserting operation of the circuit substrate 3 into the hook portions 6 will be described with reference to FIGS. 10A to 10C. First, the liquid crystal panel 1 is put on the casing 4 as shown in FIG. 10A. Then, the TCP's 2 are bent downward at the position of the sub slits 9, respectively, and then at the position of the main slits 7. In this state, a lower edge of the circuit substrate 3 become above the hook portions 6 as shown in FIG. 10B. By bending the TCP's 2 at positions of the main and sub slits 7 and 9 suitably, it is possible to insert the circuit substrate 3 into the hook portions 6 without exerting any stress on the connecting portions of the TCP's 2 to other parts, as shown in FIG. 10C.

The circuit substrate 3 may be inserted into the hook portions 6 by using other suitable bending sequence and suitable bending amounts of the main slit 7 and sub slit 9 of the TCP.

Figure 11:
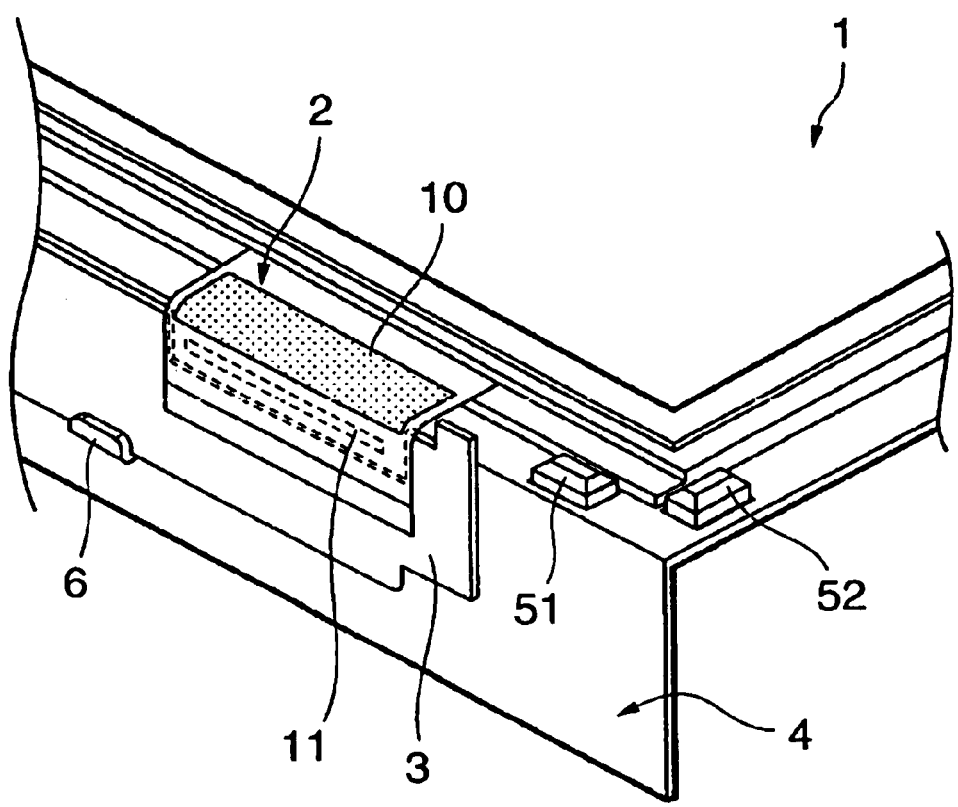
FIG. 11 is an enlarged perspective view of a corner portion of the assembled liquid crystal panel and the chassis according to the third embodiment of the present invention.

The third embodiment of the present invention will be described with reference to FIGS. 11 and 12.

A wide single slit 10 formed in the TCP 2 will be described with reference to FIG. 11. A liquid crystal panel 1 is put on a region of an upper surface of a chassis 4, which is defined by four pairs of protrusions 51 and 52, and the wide slit 10 formed in a region of the TCP 2, where a circuit substrate 3 connected to the TCP is held by hook portions 6, is bent.

The wide slit 10 is similar to a combination of the main slit 7 and the sub slit 8 of the first embodiment shown in FIG. 4. That is, in the third embodiment, the wide slit 10 is formed over a region of the TCP 2, which corresponds to the region covering the main slit 7 and the sub slit 8 and the region between the slits 7 and 8 of the first embodiment, with an insulating film 23 thinner than the insulating film 23 of the first embodiment such that the portion of the wide slit 10 is easily bent as a whole. Therefore, a region 102 of the wide slit 10 in the vicinity of the liquid crystal panel 1 corresponds in function to the sub slit 8 in the first embodiment and only a region 100 of the wide slit 10 in the bent portion of the TCP 2 corresponds in function to the main slit 7.

Figure 5C:
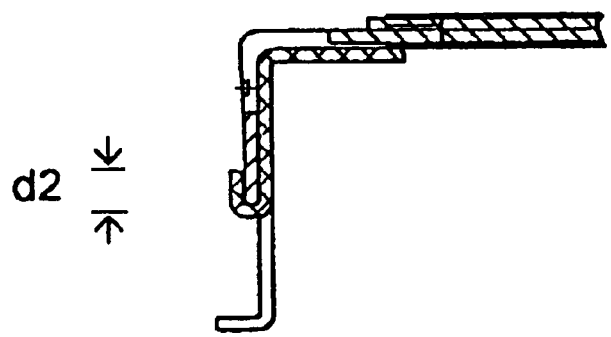
Figure 12A:
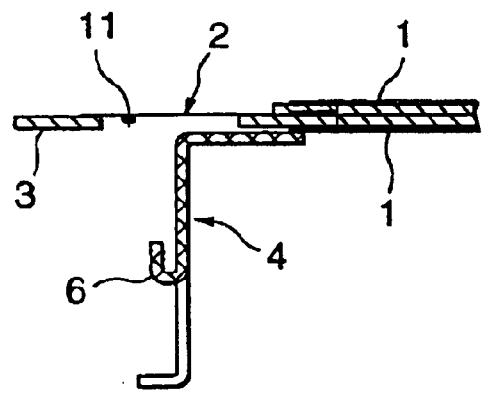
FIGS. 12A to 12C illustrate an assembling steps for holding the circuit substrate connected to the TCP's by a hook portion provided on a side surface of the chassis shown in FIG. 11.
Figure 12B:
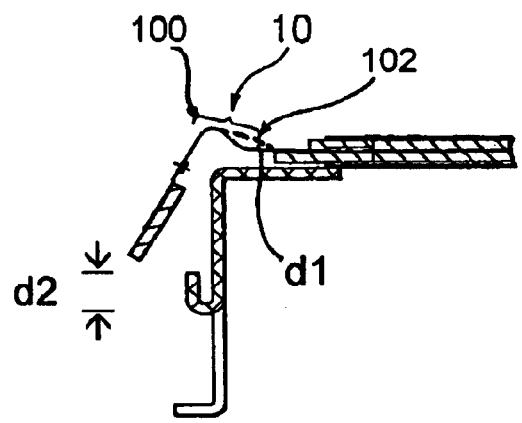
Figure 12C:
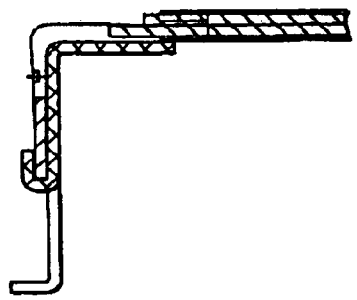

Also, as in FIGS. 5A–5C, the distance d1 between the center of the main slit portion 100 and the center of the sub slit portion 102 may be any, provided that it is larger than a depth d2 of the hook portion 6 (as shown in FIGS. 12A–12C), that is, a vertical distance for which the circuit substrate is to be pulled up.

The liquid crystal display device according to the third embodiment and a manufacturing method thereof are similar to those of the first embodiment.

The inserting operation of the circuit substrate 3 into the hook portions 6 will be described with reference to FIGS. 12A to 12C. First, the liquid crystal panel 1 is put on the chassis 4 as shown in FIG. 12A. Then, the wide slit 10 of each of the TCP's 2 is bent up at the portion thereof in the vicinity of the liquid crystal panel 1 by pulling up the circuit substrate 3 and bent downward at the portion thereof on the side of the circuit substrate 3 by making the circuit substrate 3 close to the side surface of the chassis as shown in FIG. 12B. Thereafter, the circuit substrate 3 is inserted into the hook portions 6 as shown in FIG. 12C.

Since it is possible to bend the TCP 2 smoothly by using the wide slit 10 provided therein, it becomes possible to insert the circuit substrate 3 into the hook portions 6 provided on the side surface of the chassis 4 without exerting substantial stress on the connecting portions of the TCP's 2 to other parts.

Furthermore, with the use of the TCP's 2 each having the wide slit 10, the TCP 2 can move freely in the position of the slit 10 when the liquid crystal panel 1 is deviated in the finished liquid crystal display device. Therefore, it is possible to reduce loads exerted on the portions between the TCP's 2 and the circuit substrate 3 and between the TCP's 2 and the pressure-contact portions to thereby make the connection between the TCP's 2 and the circuit substrate 3 and between the TCP's 2 and the liquid crystal panel 1 reliable.

Since, according to the manufacturing method of the third embodiment, there is only a single wide slit provided in the TCP, the number of the manufacturing steps can be reduced compared with the first or second embodiment.

As described hereinbefore, according to the present invention, a main slit for forming a rounded portion of the TCP and a sub slit as an auxiliary slit for temporarily bending the TCP are provided, it is possible not only to reduce the length of the TCP but also to absorb stress due to vibration, etc., after the liquid crystal display device is assembled.

Furthermore, since the present invention has the effect of reducing the peeling stress exerted on the connecting portions of the TCP, it is possible in view of an automated assembling work, which is important for mass-production, to improve the yield of the mass-produced product. Therefore, the present invention provides a very effective technique in view of reduction of manufacturing cost.

Furthermore, since a flat display panel such as liquid crystal panel is put on a chassis relatively loosely and the flat display panel is held by an engagement of circuit substrates connected thereto through TCP's with hook portions provided on side surfaces of the chassis, it is easily possible to disassemble not only the TCP's and the circuit substrates but also the display panel from the chassis to thereby facilitate a maintenance work, a repair work and a parts replacement work. Further, by forming an auxiliary slit in the TCP, the auxiliary slit together with a main slit can reduce a load exerted on the TCP when the display panel or the circuit substrates are moved on the chassis. Therefore, it is possible to prevent the connection between the display panel and the circuit substrates from being broken during the mounting operation of the circuit substrates and to prevent a wiring on the TCP from being broken during a vibration test or shock test of the liquid crystal display device.

Particularly, in a large size flat panel display device having a display panel, which has a plurality of TCP's on each side thereof and must be held on a chassis by hooking a circuit substrate common for the TCP's of each side in hook portions provided on a side surface of the chassis corresponding to each side of the display panel, the present invention provides important effects in improving the product yield and the reliability of product, etc.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated that the appended claims will cover any modifications or embodiments as fall within the true scope of the present invention.

What is claimed is:

1. A flat panel display device comprising:

a chassis;

a display panel put on a main surface of said chassis;

a circuit substrate held in a hook portion provided on a side surface of said chassis; and a plurality of TCP's (Tape Carrier Packages), each having one end connected to said display panel and the other end connected to said circuit substrate, each of said TCP's having a first region extending substantially in parallel to a main surface of said chassis, a second region extending substantially in parallel to said side surface of said chassis, a rounded region between said first region and said second region and a third region provided in at least one of said first and second regions, said third region having a higher flexibility than that of said at least one of said first and second regions, wherein said third region is connected to said rounded region.

2. A method for manufacturing a flat panel display device comprising the steps of:

holding a display panel having TCP's connected to a circuit substrate on a chassis;

pulling up said circuit substrate by bending each of said TCP's at a main slit portion and a sub slit portion provided as a wide common slit in each of said TCP's such that a lower end of said circuit substrate exceeds a front edge of hook portion provided on said chassis; and inserting said circuit substrate into said hook portion by returning said sub slit portion to an original flat state, wherein said sub slit portion is provided between said main slit portion and said display panel and is connected to said main slit portion to form said wide common slit and wherein a bending direction of said common slit in the vicinity of said circuit substrate in the step of pulling up said circuit substrate is opposite to a bending direction of said main slit portion in the vicinity of said display panel.

3. A method for manufacturing a flat panel display device, as claimed in claim 2, wherein said display panel is loosely fitted on said chassis.

4. A flat panel display device as claimed in claim 1, wherein said rounded region is positioned in a level lower than a surface level of said first region.

5. A flat panel display device as claimed in claim 1, wherein said TCP further has a semiconductor driver element connecting region and said third region is constructed with a plurality of lead lines covered by a flexible insulating film thinner than an insulating film in the vicinity of said semiconductor driver element connecting region.

6. A flat panel display device as claimed in claim 1, wherein said display panel is loosely fitted on said chassis such that a relative mechanical displacement of said display panel to said chassis is absorbed in said third region.

7. A flat panel display device as claimed in claim 1, wherein a distance between a center of said rounded region and a center of said third region provided in said first region is larger than a depth of said hook portion.

8. A flat panel display device as claimed in claim 1, wherein said display panel is a liquid crystal panel, said TCP is constructed with a plurality of lead lines covered by an insulating flexible film and said first and second regions of said TCP take in the form of slits extending in vertical directions to the extending direction of said TCP from said liquid crystal panel to said circuit substrate, respectively, said slits being constructed with the plurality of said lead lines covered by an insulating flexible coating member thinner than said insulating flexible film constituting said TCP.

9. A flat panel display device as claimed in claim 1, wherein a plurality of said TCP's are connected to said circuit substrate and said circuit substrate is held by the plurality of said hook portions provided on said side surface of said chassis.

10. A flat panel display device as claimed in claim 1, wherein semiconductor driver elements provided in each of said TCP's are arranged on an inner surface side of said rounded region of each of said TCP's.

* * * * *